United States Patent
Ingle et al.

(10) Patent No.: US 11,696,433 B2
(45) Date of Patent: Jul. 4, 2023

(54) 3D PITCH MULTIPLICATION

(71) Applicant: Applied Materials, Inc., Santa Clara, CA (US)

(72) Inventors: Nitin K. Ingle, Santa Clara, CA (US); Fredrick Fishburn, Aptos, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/307,366

(22) Filed: May 4, 2021

(65) Prior Publication Data

US 2021/0351183 A1   Nov. 11, 2021

Related U.S. Application Data

(60) Provisional application No. 63/022,535, filed on May 10, 2020.

(51) Int. Cl.
   *H10B 12/00* (2023.01)
(52) U.S. Cl.
   CPC .............. *H10B 12/30* (2023.02); *H10B 12/03* (2023.02); *H10B 12/05* (2023.02)
(58) Field of Classification Search
   None
   See application file for complete search history.

(56) References Cited

U.S. PATENT DOCUMENTS

| | | |
|---|---|---|
| 2010/0140608 A1 | 6/2010 | Park et al. |
| 2011/0169067 A1* | 7/2011 | Ernst ................. H01L 27/11578 257/E21.422 |
| 2014/0284686 A1* | 9/2014 | Murakami ........ H01L 29/66833 438/591 |
| 2014/0295213 A1* | 10/2014 | Jalaguier ................ C25D 13/02 540/465 |
| 2017/0358599 A1 | 12/2017 | Ramaswamy et al. |
| 2018/0090383 A1 | 3/2018 | Park |
| 2018/0226305 A1* | 8/2018 | Kueny ................. G06K 7/0095 |
| 2019/0074277 A1 | 3/2019 | Vishak et al. |
| 2019/0181142 A1 | 6/2019 | Fishburn et al. |
| 2020/0135568 A1 | 4/2020 | Boemmels et al. |

OTHER PUBLICATIONS

PCT International Search Report and Written Opinion in PCT/US2021/030772 dated Aug. 20, 2021, 8 pages.

* cited by examiner

*Primary Examiner* — Nicholas J Tobergte
*Assistant Examiner* — Kevin Quinto
(74) *Attorney, Agent, or Firm* — Servilla Whitney LLC

(57) ABSTRACT

Memory devices and methods of manufacturing memory devices are provided. Described are devices and methods where 3D pitch multiplication decouples high aspect ratio etch width from cell width, creating small cell active area pitch to allow for small DRAM die size.

17 Claims, 11 Drawing Sheets

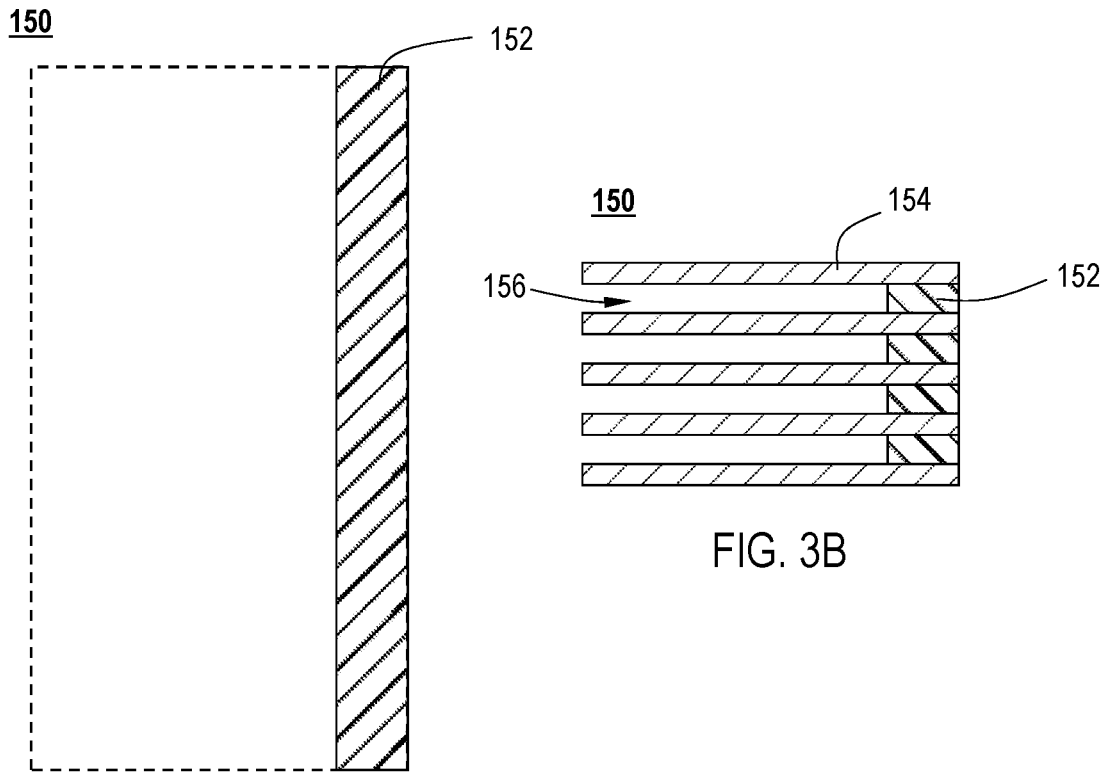
FIG. 3A
FIG. 3B
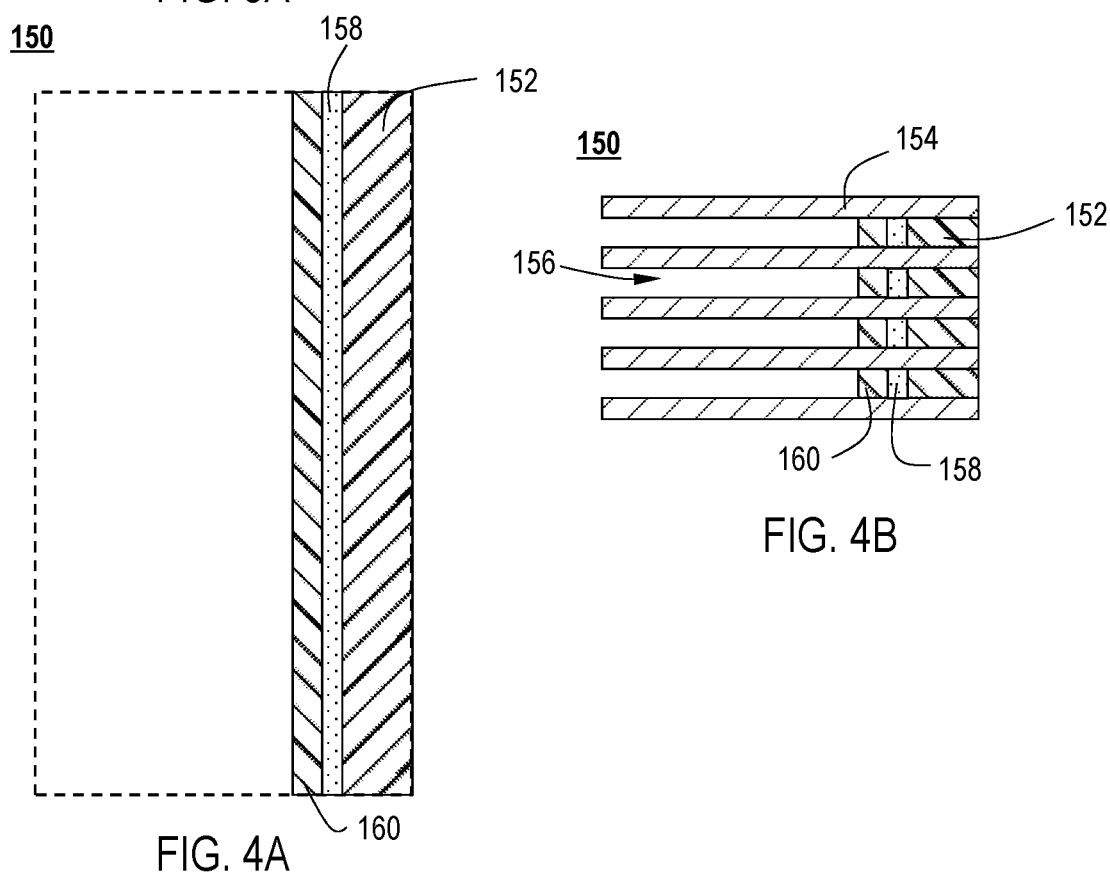
FIG. 4A
FIG. 4B

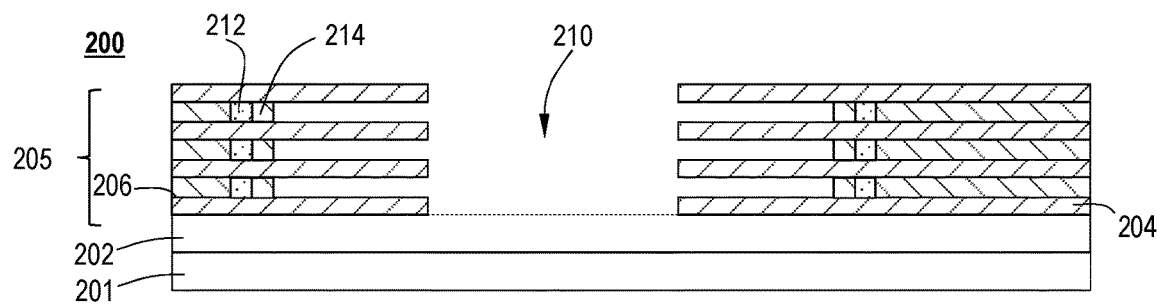
FIG. 8C
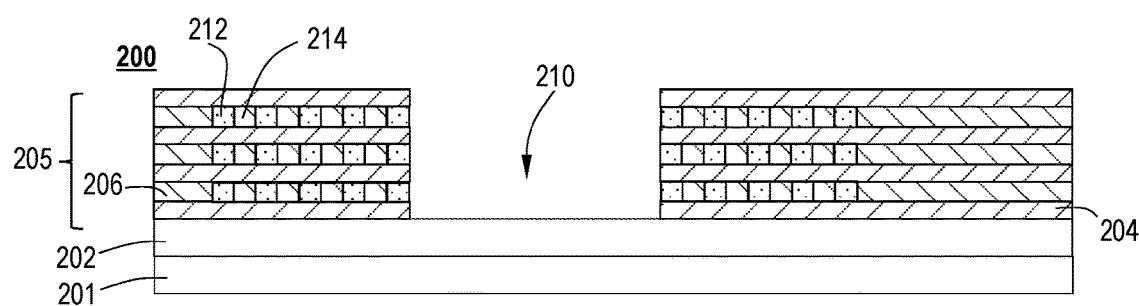
FIG. 8D
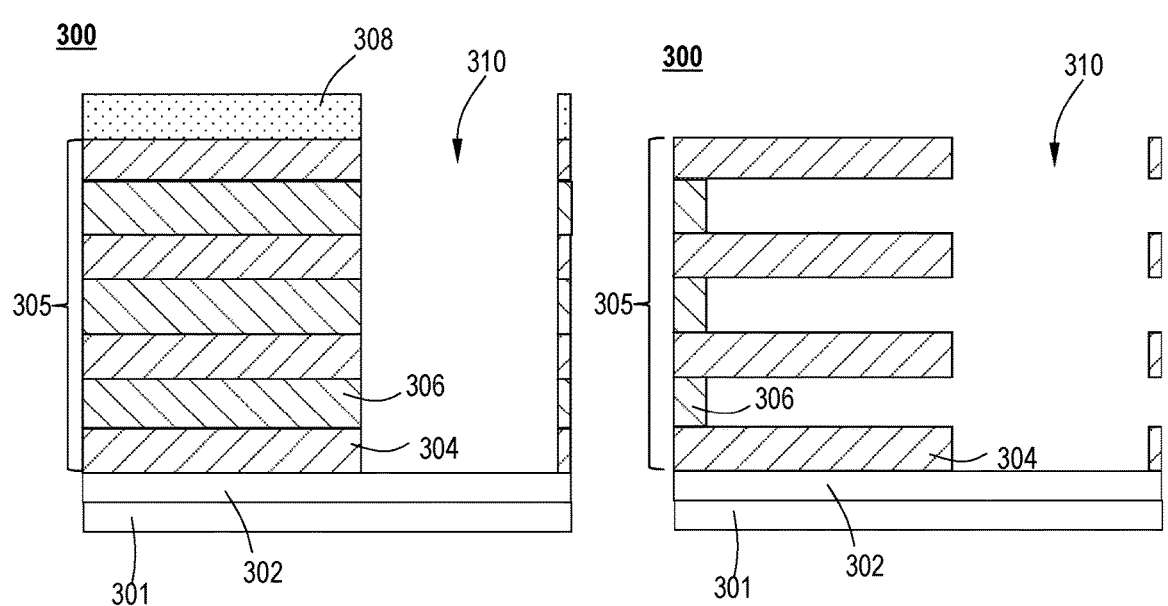
FIG. 9A
FIG. 9B

3D PITCH MULTIPLICATION

CROSS-REFERENCE TO RELATED APPLICATIONS

This application claims priority to U.S. Provisional Application No. 63/022,535, filed May 10, 2020, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide 3D-DRAM memory cells and methods for forming 3D-DRAM memory cells.

BACKGROUND

Semiconductor technology has advanced at a rapid pace and device dimensions have shrunk with advancing technology to provide faster processing and storage per unit space. In DRAM devices, one of the main goals is to increase storage per unit space, which results in an increase of the vertical dimensions or the stack height of the 3D DRAM devices.

In existing 3D DRAM memory, 160 nm wide slits and 80 nm holes with 150 nm pitch are the smallest features which can be etched to 5-10 μm deep multi-layer film stacks of oxide-nitride or 3-5 μm for oxide-polysilicon. This etch is needed to access each tier in the stack for processing, but smaller pitch, especially in the word line direction could allow for higher density of memory.

Accordingly, there is a need in the art for 3D-DRAM devices and methods for forming the 3D-DRAM devices with improved smaller pitch and higher density of memory.

SUMMARY

One or more embodiments of the disclosure are directed to semiconductor memory device. In one embodiment, semiconductor memory device comprises: a first memory stack comprising alternating layers of a first material layer and a second material layer on a first portion of the device, the first memory stack comprising a first active area having a first width and a first space; a second memory stack on a second portion of the device, the second memory stack comprising alternating layers of the first material layer and the second material layer and comprising a second active area having a second width and a second space; and a high aspect ratio opening separating the first portion from the second portion; and a dielectric layer separating the first material layers from the second material layers, wherein the pitch of the first active area and the second active area is in a range of from about 50 nm to about 80 nm.

Additional embodiments of the disclosure are directed to methods of forming an electronic device. In one an embodiment, a method of forming an electronic device comprises: forming a memory stack comprising alternating layers of a first material layer and a second material layer; forming an opening in the memory stack; recessing the second material layer to form a gap; growing a third material in the gap; and growing a fourth material in the gap adjacent to the third material to form an active area, wherein the pitch of the active area is in a range of from about 30 nm to about 50 nm.

Further embodiments of the disclosure are directed to a non-transitory computer readable medium including instructions, that, when executed by a controller of a processing system, causes the processing system to perform operations of: form a memory stack comprising alternating layers of a first material layer and a second material layer; form an opening in the memory stack; recess the second material layer to form a gap; grow a third material in the gap; and grow a fourth material in the gap adjacent to the third material to form an active area, wherein the pitch of the active area is in a range of from about 30 nm to about 50 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 3A illustrates a top view of a device according to one or more embodiments;

FIG. 3B illustrates a cross-sectional view of the device of FIG. 3A according to one or more embodiments;

FIG. 4A illustrates a top view of a device according to one or more embodiments;

FIG. 4B illustrates a cross-sectional view of the device of FIG. 4A according to one or more embodiments;

FIG. 8C illustrates a cross-sectional view of a device according to one or more embodiments;

FIG. 8D illustrates a cross-sectional view of a device according to one or more embodiments;

FIG. 9A illustrates a cross-sectional view of a device according to one or more embodiments;

FIG. 9B illustrates a cross-sectional view of a device according to one or more embodiments;

DETAILED DESCRIPTION

Figure 1:
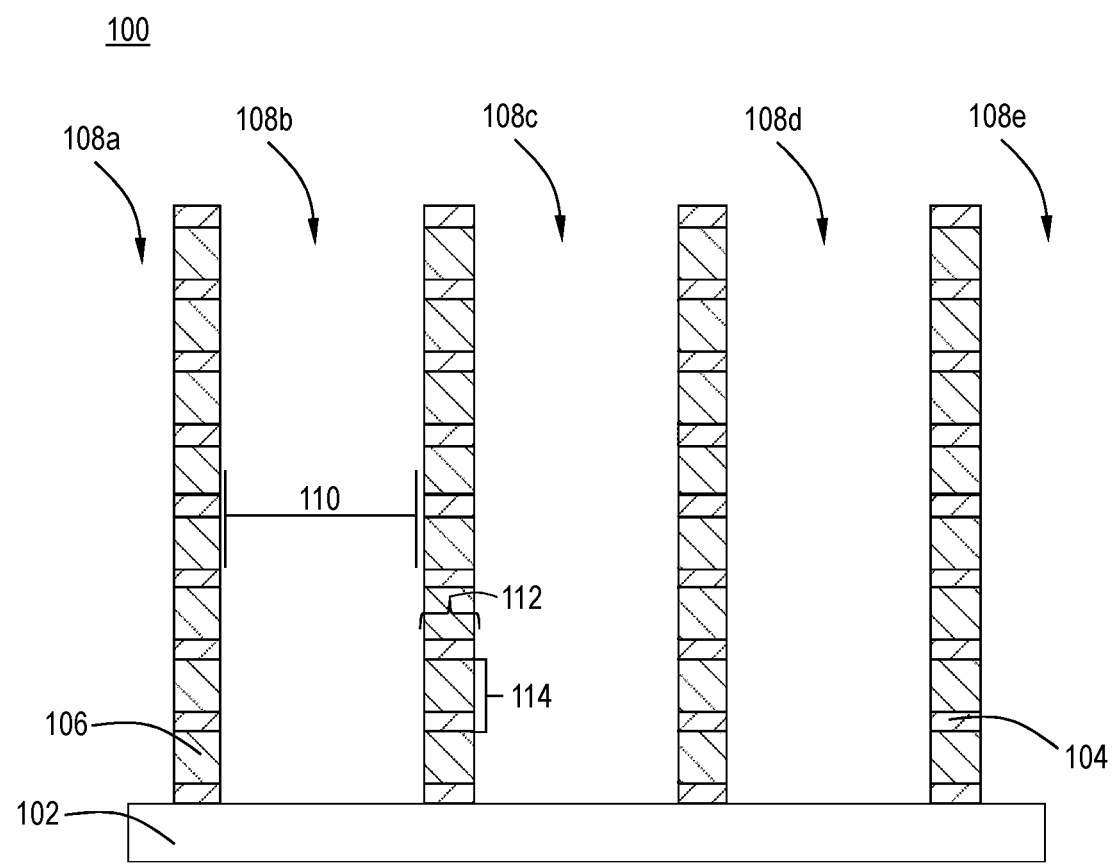
FIG. 1 illustrates a cross-sectional view of a device according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon dioxide, strained silicon, silicon on insulator (SOI), carbon doped silicon dioxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used herein, the term "dielectric layer" refers to a layer of material that is an electrical insulator that can be polarized in an electric field. In one or more embodiments, the dielectric layer comprises one or more of oxides, carbon doped oxides, silicon dioxide ($SiO_2$), porous silicon dioxide ($SiO_2$), silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the dielectric layer includes, without limitation, furnace, CVD, PVD, ALD and spin-on-coat (SoC) deposited films. In one or more embodiments, the dielectric layer may be exposed to in-situ or ex-situ pretreatment and post-treatment process to dope, infuse, implant, heat, freeze, polish, etch, reduce, oxidize, hydroxylate, anneal, UV cure, e-beam cure and/or bake the surface or bulk of the dielectric. In addition to film processing directly on the surface of the dielectric layer itself, in one or more embodiments, any of the film processing steps disclosed may also be performed on an underlayer formed on the dielectric layer as disclosed in more detail below, and the term "dielectric surface" is intended to include such underlayer as the context indicates. Thus, for example, where a film/layer or partial film/layer has been deposited onto a dielectric surface, the exposed surface of the newly deposited film/layer becomes the dielectric surface.

As used herein, the term "channel" refers to a layer of material that is an electrical conductor. In one or more embodiments, the channel comprises one or more silicon, polysilicon, amorphous silicon, doped silicon, strained silicon, silicon on insulator (SOI), carbon doped silicon dioxides, SiGe, germanium, gallium arsenide, GaN, InP, carbon nanotube, and any other materials such as III-IV group, 2D TMD metals, metal oxides, metal nitrides, metal alloys, and other conductive materials, depending on the application. In one or more embodiments, the channel may be exposed to in-situ or ex-situ pretreatment and post-treatment processes to plate, fuse, freeze, heat, microwave, polish, etch, reduce, oxidize, hydroxylate, anneal, UV cure, e-beam cure and/or bake the surface or bulk of the channel. In addition to film processing directly on the surface or bulk structure of the channel itself, in one or more embodiments, any of the film processing steps disclosed may also be performed on an underlayer formed on the channel as disclosed in more detail below, and the term "channel surface" is intended to include such underlayer as the context indicates. Thus, for example, where a film/layer or partial film/layer has been deposited onto a channel surface, the exposed surface of the newly deposited film/layer becomes the channel surface.

As used herein, the term "bit line" or "source" refers to a layer of material that is an electrical conductor. In one or more embodiments, the channel comprises one or more silicon, polysilicon, epitaxial silicon, amorphous silicon, doped silicon, strained silicon, silicon on insulator (SOI), carbon doped silicon dioxides, SiGe, germanium, Epi Ge, Epi SiGe, gallium arsenide, GaN, InP, carbon nanotube, and any other materials such as 2D TMD metals, metal oxides, metal nitrides, metal alloys, and other conductive materials, depending on the application. In one or more embodiments, the bit line includes, without limitation, growth silicon. Bit line may be exposed to in-situ or ex-situ pretreatment and post-treatment process to fuse, freeze, heat, microwave, polish, etch, reduce, oxidize, hydroxylate, anneal, UV cure, e-beam cure and/or bake the bulk or surface of the bit line. In addition to film processing directly on the surface or bulk structure of the bit line itself, in the present disclosure, any of the film processing steps disclosed may also be performed on an underlayer formed on the bit line as disclosed in more detail below, and the term "bit line surface" is intended to include such underlayer as the context indicates. Thus for example, where a film/layer or partial film/layer has been deposited onto a bit line surface, the exposed surface of the newly deposited film/layer becomes the bit line surface.

As used herein, the term "word line" or "gate" or "gate Electrode", refers to a layer of material that is an electrical field generating or conductor material. In one or more embodiments, the word line comprises one or more polysilicon, amorphous silicon, tungsten, ruthenium, cobalt, high-k dielectric, and any other materials such as 2D TMD metals MoS, metal oxides, metal nitrides, metal alloys, and other conductive materials, depending on the application. Word line include, without limitation, tungsten (W). Word line may be exposed to in-situ or ex-situ pretreatment and post-treatment process to fuse, freeze, heat, microwave, polish, etch, reduce, oxidize, hydroxylate, anneal, UV cure, e-beam cure and/or bake the metal surface & bulk. In addition to film processing directly on the surface or bulk structure of the word line itself, in the present disclosure, any of the film processing steps disclosed may also be performed on an underlayer formed on the word line as disclosed in more detail below, and the term "word line surface" is intended to include such underlayer as the context indicates. Thus for example, where a film/layer or partial film/layer has been deposited onto a word line surface, the exposed surface of the newly deposited film/layer becomes the word line surface.

As used herein, the term "capacitor" or "reservoir" refers to a layer of material that is an electrical charge storage dam. In one or more embodiments, the capacitor comprises one or more metal, TiN, SN, Zr, ZrO, ZrAlO, AlO, Al, Nb, NgO and any other materials such as 2D TMD metals MoS, metal oxides, metal nitrides, metal alloys, and other conductive materials, depending on the application. Capacitors may be exposed to a pretreatment process to fuse, freeze, heat, microwave, polish, etch, reduce, oxidize, hydroxylate, anneal, UV cure, e-beam cure and/or bake the surface. In addition to film processing directly on the surface or bulk structure of the capacitor itself, in the present disclosure, any of the film processing steps disclosed may also be performed on an underlayer formed on the capacitor as disclosed in more detail below, and the term "capacitor surface" is intended to include such underlayer as the context indicates. Thus for example, where a film/layer or partial film/layer has been deposited onto a capacitor surface, the exposed surface of the newly deposited film/layer becomes the capacitor surface.

As used herein, the term "active area" refers to a layer of material in which a channel, a bit line, a word line, or a capacitor can be made. In one or more embodiments, the active area comprises one or more of silicon or doped silicon. For example, in one or more embodiments, the channel material is selected from one or more of Si, molybdenum sulfide ($MoS_2$), or IGZO (In—Ga—Zn Oxide) and replaces the cavities after the active area material has been structured.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor.

Existing 3D-NAND memory stacks with alternating layers of oxide and nitride require replacement metal gate (RMG) process to build word lines. Because the stack height is becoming larger, high aspect ratio (HAR) memory hole etch/fill processes and stress control are becoming more difficult. In 3D-NAND memory for example, 160 nm wide slits and 80 nm holes with a 125 nm pitch are the smallest features which can be etched into 5-10 μm deep multi-layer film stacks of oxide-nitride or 3-5 μm for oxide-polysilicon. This 160 nm slit etch is the space between active areas and is used to access each tier in the stack for processing, but smaller slits, especially in the word line direction, for example, 20-50 nm, could result in smaller pitches, like 50-80 nm, which could permit a higher density memory. Etching these 20-50 nm wide slits many microns deep is very difficult.

One or more embodiments advantageously provide that instead of one device or memory cell being created for each single memory hole or slit, many memory cells can be structured in that pitch. For example, currently a 160 nm wide slit and 50 nm space, a single memory cell is made having a higher pitch, e.g. 210 nm pitch. Using the method according to one or more embodiments, the same wide slit, e.g. 160 nm, with a 1200 nm space and 16 line-space pitches can be created at 75 nm each. Accordingly, in this 160+1200=1360 nm space, there can advantageously be 16 memory cells with a 1360/16=85 nm effective pitch. This is three times smaller than the memory cell size.

One or more embodiments advantageously provide using existing processing techniques to reduce the minimum memory pitch from about 200 nm minimum pitch to less than or equal to 75 nm, depending upon the film deposited and recess uniformity. The result is three times larger memory cell density for about 60% smaller die size.

In one or more embodiments, sequential depositions are used to form many active area regions. In one or more embodiments, alternating layers of films, e.g. oxide-polysilicon, polysilicon-nitride, oxide-nitride, silicon-silicon germanium, are deposited. Each repeated set of layers can form a memory cells in each tier in the final structuring process.

In one or more embodiments, an oxide-polysilicon tier stack is formed using selective deposition of silicon germanium (SiGe) for the 3D pitch multiplication films. In one or more embodiments, after etching a high aspect ratio (e.g. about 160 nm wide×1000 nm long) active area slits spaced (about 80 nm) apart tip to tip and spaced (about 1320 nm) apart side to side through the stack of layers, the polysilicon layer, for example, in each tier is selectively etched back to almost fully remove the polysilicon between slits, leaving only a small amount (e.g. about 50 nm) of polysilicon. High germanium (Ge) content silicon germanium (SiGe) is selectively grown to a thickness of about 20 nm, followed by another selectively grown layer of low germanium (Ge) content silicon germanium (SiGe) of about 60 nm thick. In one or more embodiments, this process of alternating SiGe films is repeated eight times to form sixteen pairs of layers between each slit. In one or more embodiments, the word line slit is formed orthogonal to, and centered on the gap between the active area slits by doing a wide (e.g. about 160 nm) oxide-polysilicon slit etch. In one or more embodiments, the high content Ge SiGe layer is selectively etched back to isolated memory cells in the direction of the word line slit.

In other embodiments, an oxide-nitride tier stack is formed using non-selective deposition/recess etching of PSG/USG for the 3D pitch multiplication films. In one or more embodiments, an oxide-nitride tier stack is formed using non-selective deposition and recess etching of PSG (phos doped ALD oxide) and USG (undoped ALD oxide).

As used herein, the term "3D pitch multiplication" refers to the concept of forming multiple independent active area regions between each set of slits, segments or holes in the tier stack.

As used herein, the term "high aspect ratio (HAR)" refers to the ratio of the depth of a feature to the width of the feature. In some embodiments, the aspect ratio of the slit or opening is greater than or equal to about 30:1, 35:1, 40:1, 50:1, 60:1, 70:1 or 80:1.

FIG. 1 illustrates a cross-sectional view of a device 100 according to the prior art. The cross-sectional view is across the active area slits, with a view from the sidewall of the wordline slit etch. The device 100 of the prior art has no pitch division. The device 120 comprises alternating layers 104 and 106 on a substrate 102. There are five high aspect ratio (HAR) active area slits 108a, 108b, 108c, 108d, and 108e. Each high aspect ratio (HAR) active area slit 108 has an active area slit width 110 having a width of about 120 nm. The active area slit width 110 is equivalent to the cell space. The active area 112 has a width of about 30 nm. The horizontal pitch of the cell is the width plus space, or in this case 150 nm. The vertical pitch of the cell is the thickness of layers 106 plus 104, shown by 114 of about 60 nm. Herein, when describing the device pitch, it is referring to the horizontal pitch.

Figure 2:
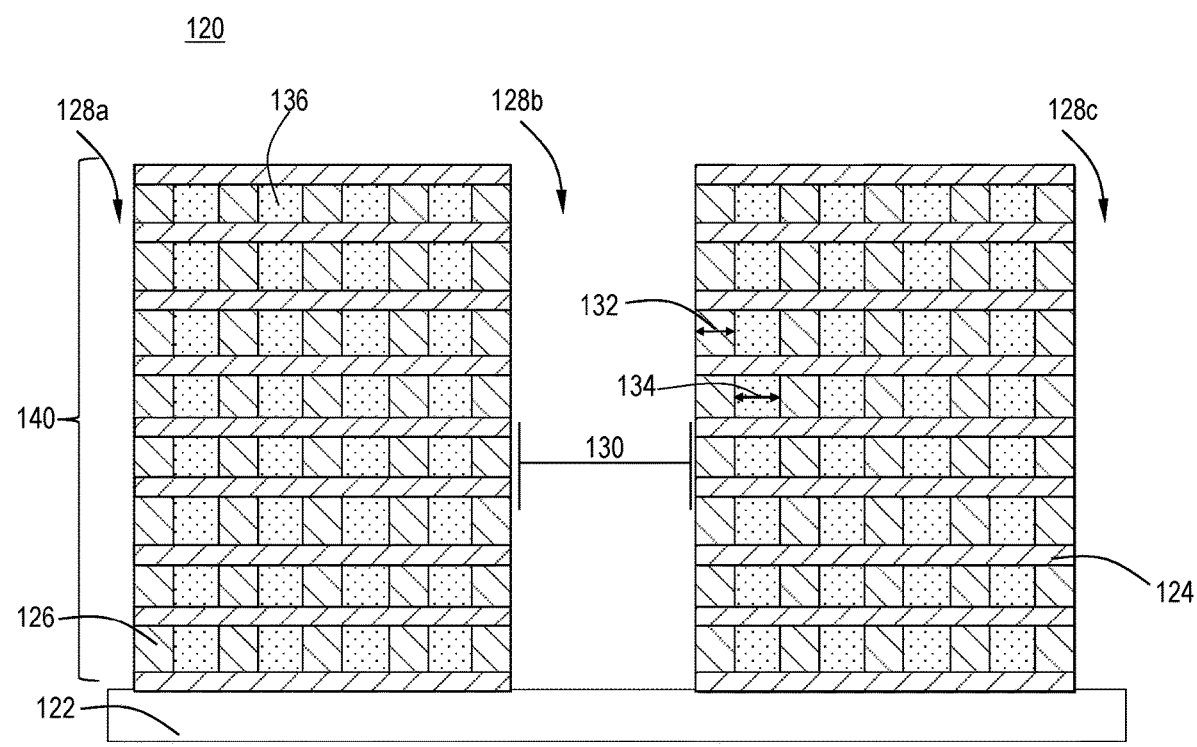
FIG. 2 illustrates a cross-sectional view of a device according to one or more embodiments.

FIG. 2 illustrates a cross-sectional view of a device 120 according to one or more embodiments. The cross-sectional view is across the active area slits after a 3D pitch multiplication, with a view from the sidewall of the wordline slit etch. In one or more embodiments, the device 120 has undergone a 3D pitch multiplication. The device 120 comprises alternating layers 124 and 126 on a substrate 122. There are three high aspect ratio (HAR) active area slits 128a, 128b, and 128c. Each high aspect ratio (HAR) active area slit 128 has an active area slit width 130 having a width in a range of from about 100 nm to about 160 nm. In one or more embodiments, the active area 132 has a width in a range of about 20 nm to about 40 nm, including about 30 nm, and an active area space 134 in a range of about 20 nm to about 40 nm, including about 30 nm. In one or more embodiments, 3D pitch multiplication decouples high aspect ratio (HAR) etch width from cell width, creating a small cell active area pitch to permit a small DRAM die size. In one or more embodiments, the active area pitch is in a range of from about 50 nm to about 80 nm. In one or more embodiments, a dielectric layer 136 separates the first material 124 layers from one another.

The substrate 122 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

In one or more embodiments, a semiconductor layer (not illustrated) is on the substrate 122. In one or more embodiments, the semiconductor layer may also be referred to as the common source line. The semiconductor layer can be formed by any suitable technique known to the skilled artisan and can be made from any suitable material including, but not limited to, poly-silicon (poly-Si). In some embodiments, the semiconductor layer is a common node that is made of a conductive or a semiconductor material.

An optional sacrificial layer (not illustrated) may be formed on the semiconductor layer and can be made of any suitable material. The sacrificial layer in some embodiments is removed and may be replaced in later processes. In some embodiments, the sacrificial layer is not removed and remains within parts of the electronic device, e.g. a memory device. In this case, the term "sacrificial" has an expanded meaning to include permanent layers as well.

In one or more embodiments, the first material layer 124 and the second material layer 126 independently comprise one or more of silicon (Si), silicon germanium (SiGe), silicon dioxide (SiO), silicon nitride (SiN), silicon oxynitride (SiON), polysilicon and other materials compatible with the following standard semiconductor processes. In one or more embodiments, the first material layer 124 and the second material layer 126 are deposited by one or more of plasma enhanced chemical vapor deposition (PECVD), physical vapor deposition (PVD), or epitaxial deposition. This process can be used for any multiple layer film stack deposition, e.g. Si/SiGe or Silicon nitride/silicon dioxide for example, on any substrate including a dielectric, including, but not limited to, silicon dioxide ($SiO_2$), silicon nitride ($Si3N4$), or a semiconductor substrate, including, but not limited to, silicon (Si) or silicon germanium (SiGe).

In one or more embodiments, the dielectric layer 136 may comprise any suitable dielectric material, e.g. electrical insulator that can be polarized in an electric field, known to the skilled artisan. In some embodiments, the dielectric layer 136 comprises one or more of oxides, carbon doped oxides, silicon dioxide (SiO), porous silicon dioxide ($SiO_2$), silicon dioxide (SiO), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH).

In one or more embodiments memory stack 140 is formed. The memory stack 140 in the illustrated embodiment comprises a plurality of alternating the stack; such as the first material layers 124 and the second material layers 126. In a similar way three or more films deposited in a some sequences can form each set of films to form each vertical set of memory cells.

While the memory stack 140, illustrated in FIG. 2, has eight pairs of alternating first material layers 124 and second material layers 126, one of skill in the art recognizes that this is merely for illustrative purposed only. The memory stack 140 may have any number of alternating first material layers 124 and second material layers 126. For example, in some embodiments, the memory stack 140 comprises greater than 50 pairs of alternating first material layers 124 and second material layers 126, or greater than 100 pairs of alternating first material layers 124 and second material layers 126, or greater than 200 pairs of alternating first material layers 124 and second material layers 126.

In one or more embodiments, a lateral laminate growth process is used for 3D pitch multiplication. FIGS. 3A to 7B illustrate the lateral laminate growth process of one or more embodiments. FIG. 3A illustrates a top view of a device 150 according to one or more embodiments. FIG. 3B illustrates a cross-sectional view of the device 150 of FIG. 3A according to one or more embodiments. In one or more embodiments, slit etching is done to form at least one opening 156 in the tier isolation layer 154. The silicon layer 152 can then be recessed using any suitable recess technique known to the skilled artisan, including, but not limited to, wet etching, vapor etching, isotropic plasma etch or any other Selective Removal Process (SRP).

FIG. 4A illustrates a top view of the device 150 according to one or more embodiments. FIG. 4B illustrates a cross-sectional view of the device 150 of FIG. 4A according to one or more embodiments. In one or more embodiments, a first tier gap layer 160 and a second tier gap layer 158 are selectively grown are selectively grown in the at least one opening 156. In one or more embodiments, the first tier gap layer 160 and the second tier gap layer 158 may comprise any suitable material known to the skilled artisan. In one or more embodiments, the first tier gap layer 160 and the second tier gap layer 158 independently comprise one or more of silicon (Si), silicon germanium (SiGe), silicon dioxide (SiO), silicon nitride (SiN), and silicon oxynitride (SiON). In one or more embodiments, the first tier gap layer 160 and the second tier gap layer 158 are deposited by epitaxial deposition or some other selective deposition or reaction process. This process can be used for any multiple layer film stack deposition, e.g., nitrides or oxynitrides formed on Si, SiGe, or other materials.

Figure 5A:
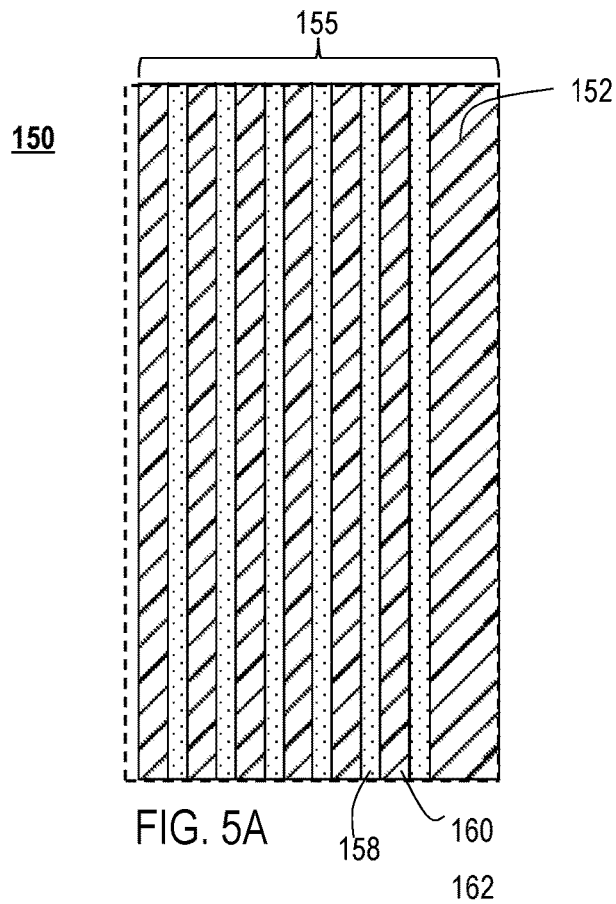
FIG. 5A illustrates a top view of a device according to one or more embodiments.
Figure 5B:
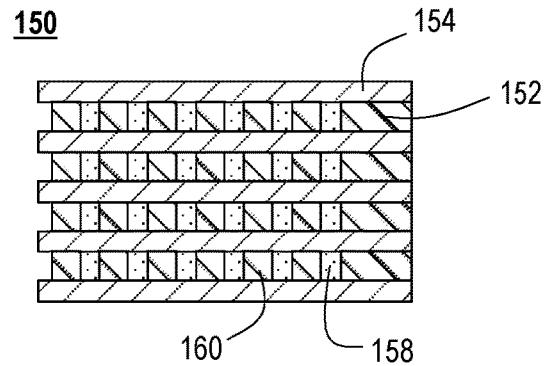
FIG. 5B illustrates a cross-sectional view of the device of FIG. 5A according to one or more embodiments.

FIG. 5A illustrates a top view of the device 150 according to one or more embodiments. FIG. 5B illustrates a cross-sectional view of the device 150 of FIG. 5A according to one or more embodiments. In one or more embodiments, a first tier gap layer 160 and a second tier gap layer 158 are selectively grown in the at least one opening 156 to fill the at least one opening 156.

In one or more embodiments, one side of the pitch multiplication structure is shown in 155. The memory stack 155 in the illustrated embodiment comprises a plurality of alternating the first tier gap layers 160 and the second tier gap layers 158 formed on one side of the initial layer 152. In one or more embodiments, the second tier gap layer 158 comprises silicon (Si). In one or more embodiments, the first tier gap layer 160 comprises silicon germanium (SiGe). Therefore, in some embodiments, the memory stack 155 comprises alternating layers of silicon (Si) and silicon germanium (SiGe).

While the memory stack 155, illustrated in FIG. 5A, has six pairs of alternating first tier gap layers 160 and the second tier gap layers 158 on each side of 152, one skilled in the art recognizes that this is merely for illustrative purposed only. The memory stack 155 may have any number of alternating first tier gap layers 160 and the second tier gap layers 158. For example, in some embodiments, the memory stack 155 comprises 1 pair of alternating first tier gap layers 160 and the second tier gap layers 158. In other embodiments, the memory stack 155 comprises 2 or more pairs of alternating first tier gap layers 160 and the second tier gap layers 158 per side, or greater than 4 pairs of alternating first tier gap layers 160 and the second tier gap layers 158 per side for 8 total pairs between slits. Larger numbers of pairs beyond 4 become more difficult to process for diminishing return, making 1 to 4 pairs more desirable embodiments.

Figure 6A:
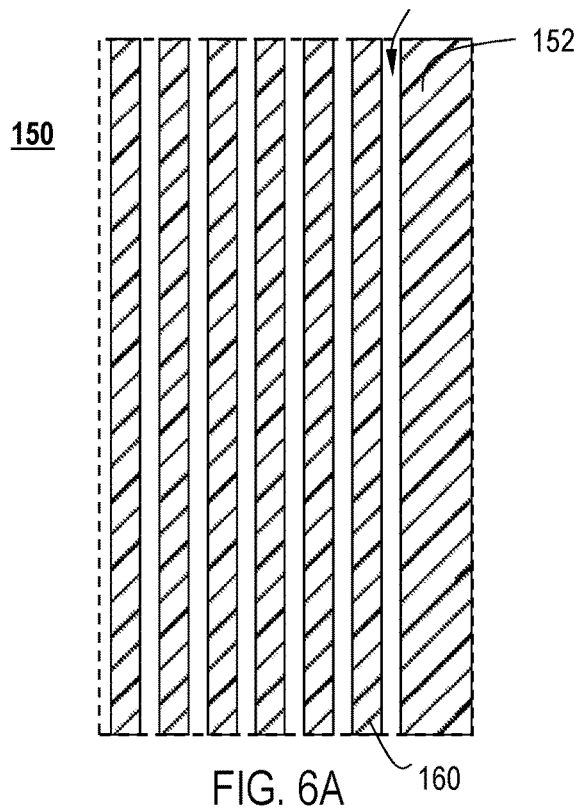
FIG. 6A illustrates a top view of a device according to one or more embodiments.
Figure 6B:
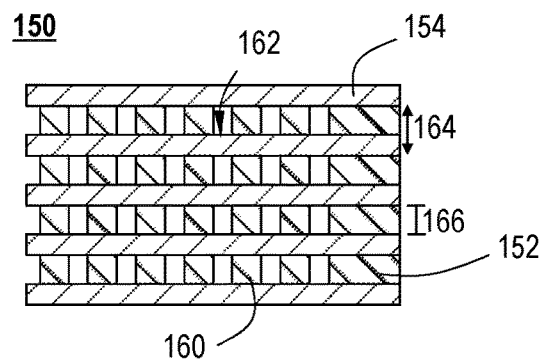
FIG. 6B illustrates a cross-sectional view of the device of FIG. 6A according to one or more embodiments.

FIG. 6A illustrates a top view of the device 150 according to one or more embodiments. FIG. 6B illustrates a cross-sectional view of the device 150 of FIG. 6A according to one or more embodiments. In one or more embodiments, the first tier gap layer 160 is removed to form second opening 162. The tier pitch 164 is in a range of from about 45 nm to about 80 nm. The tier space 166 is in a range of from about 25 nm to about 60 nm.

Figure 7A:
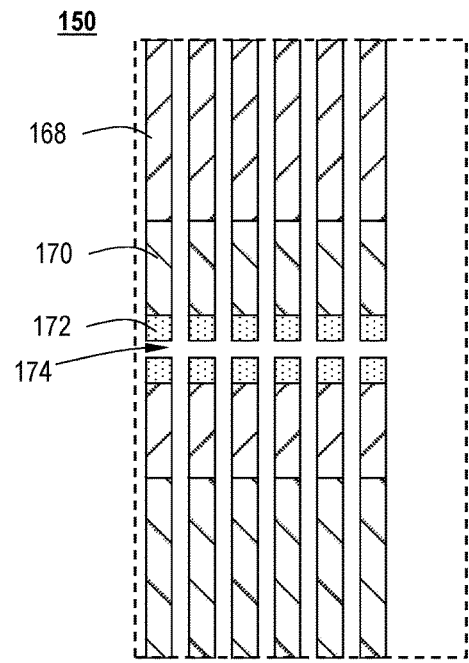
FIG. 7A illustrates a top view of a device according to one or more embodiments.
Figure 7B:
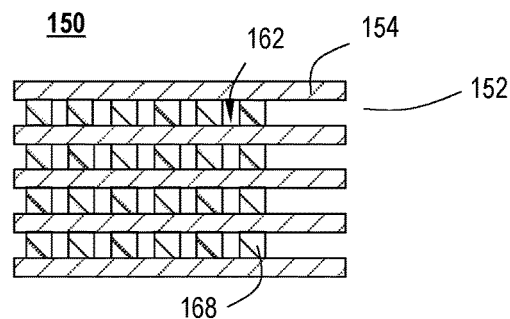
FIG. 7B illustrates a cross-sectional view of the device of FIG. 7A according to one or more embodiments.

FIG. 7A illustrates a top view of a set of DRAM cells 150 which can then be constructed with common processing according to one or more embodiments. FIG. 7B illustrates a cross-sectional view of the device 150 of FIG. 7A viewed from the wordline slit etched gap 174 according to one or more embodiments. After removing one of the tier gap layers isolation spaces 162 can be formed, which can then be filled with a suitable dielectric material to isolated devices. Alternately, the one or the other tier gap layer removed can be replaced with a material used to form the active memory cell and the other tier gap material left in place or also removed and replaced, to form the isolation between memory cells. In one or more embodiments, the active tier gap layer 160 is replace with materials to form the DRAM capacitor 168, and another section of the active tier gap layer is used to form the transistor 170 for the DRAM memory cell. Common isolation materials between 168, 170 and 172 are SiO2 and Si3N4. In one or more embodiments, there is an opening 174 between the vertical bitline interconnect for the DRAM memory cell operation.

Figure 8A:
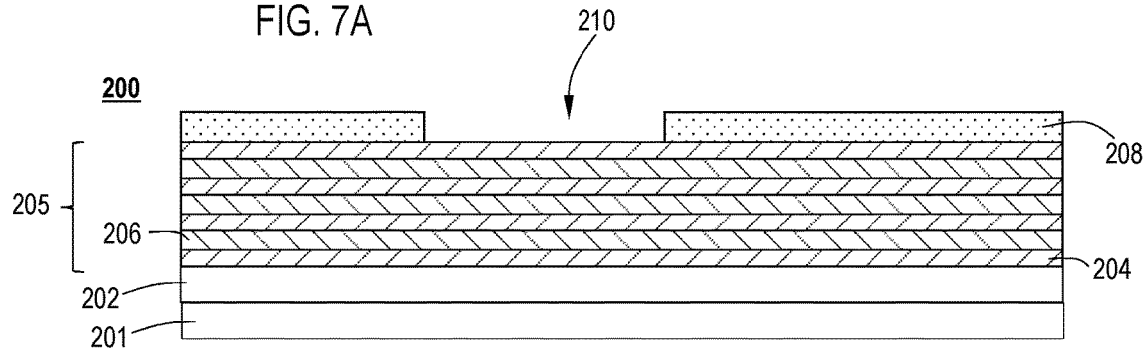
FIG. 8A illustrates a cross-sectional view of a device according to one or more embodiments.

In one or more embodiments, a selective growth method is used for 3D pitch multiplication. FIGS. 8A to 8D illustrate cross-sectional views of a device 200 prepared using the selective growth method of one or more embodiments. With reference to FIG. 8A, in one or more embodiments, a memory stack 205 is formed. The memory stack 205 in the illustrated embodiment comprises a plurality of alternating the first material layers 204 and the second material layer 206 on a semiconductor layer 202 on a substrate 201.

In one or more embodiments, a semiconductor layer 202 is on the substrate 201. In one or more embodiments, the semiconductor layer 202 may also be referred to as the logic interface layer. The semiconductor layer 202 can be formed by any suitable technique known to the skilled artisan and can be made from any suitable material including, but not limited to, poly-silicon (poly-Si). In some embodiments, the semiconductor layer 202 is a contact layer to the underlying CMOS logic circuits.

An optional sacrificial layer (not illustrated) may be formed on the semiconductor layer 202 and can be made of any suitable material. The sacrificial layer in some embodiments is removed and replaced in later processes. In some embodiments, the sacrificial layer is not removed and remains within the electronic device, e.g. a memory device. In this case, the term "sacrificial" has an expanded meaning to include permanent layers and may be referred to as the conductive layer.

In one or more embodiments, the first material layer 204 and the second material layer 206 may comprise any suitable material known to the skilled artisan. In one or more embodiments, the first material layer 204 and the second material layer 206 independently comprise one or more of silicon (Si), silicon germanium (SiGe), silicon dioxide ($SiO_2$), silicon nitride (SiN), silicon oxynitride (SiON), and polysilicon. In one or more embodiments, the first material layer 204 and the second material layer 206 are deposited by one or more of plasma enhanced chemical vapor deposition (PECVD), physical vapor deposition (PVD), or epitaxial deposition. This process can be used for any multiple layer film stack deposition, e.g. Si/SiGe, on any substrate including a dielectric, including, but not limited to, silicon dioxide ($SiO_2$), and a semiconductor substrate, including, but not limited to, silicon (Si) or silicon germanium (SiGe). In one or more embodiments, the first material layer comprises silicon dioxide ($SiO_2$) and the second material layer comprises polysilicon.

In one or more embodiments, the first material layer 204 and the second material layer 206 may have any suitable thickness. In specific embodiments, the first material layer 204 has a thickness in a range of about 15 nm to about 25 nm, including about 20 nm. In specific embodiments, the second material layer 206 has a thickness in a range of about 25 nm to about 45 nm, including about 30 nm, or about 35 nm.

While the memory stack 205, illustrated in FIG. 8A, has three pairs of alternating first material layers 204 and second material layers 206, one of skill in the art recognizes that this is merely for illustrative purposed only. The memory stack 205 may have any number of alternating first material layers 204 and second material layers 206. For example, in some embodiments, the memory stack 205 comprises 192 pairs of alternating first material layers 204 and second material layers 206. In other embodiments, the memory stack 205 comprises greater than 100 pairs of alternating first material layers 204 and second material layers 206, or greater than 200 pairs of alternating first material layers 204 and second material layers 206, or greater than 300 pairs of alternating first material layers 204 and second material layers 206.

In one or more embodiments, a hard mask 208 is on a top surface of the memory stack 205. In one or more embodiments, the hard mask layer 208 can be deposited using one or more mask layer deposition techniques known to one of ordinary skill in the art of microelectronic device manufacturing. In one or more embodiments, the hard mask layer 208 is deposited using one of deposition techniques, such as, but not limited to, ALD, CVD, PVD, MBE, MOCVD, spin-on, or other deposition techniques known to the skilled artisan. In one or more embodiments, the hard mask layer 208 comprises a material selected from one or more of spin-on carbon, hard mask, or a photoresist. The skilled artisan will understand that multiple hard mask layers 208 may be present. In one or more embodiments, the hard mask layer 208 comprises silicon nitride (SiN).

In one or more embodiments, the device 200 is patterned to form an active area opening 210. Patterning may comprises any suitable patterning technique known to one of skill in the art.

Figure 8B:
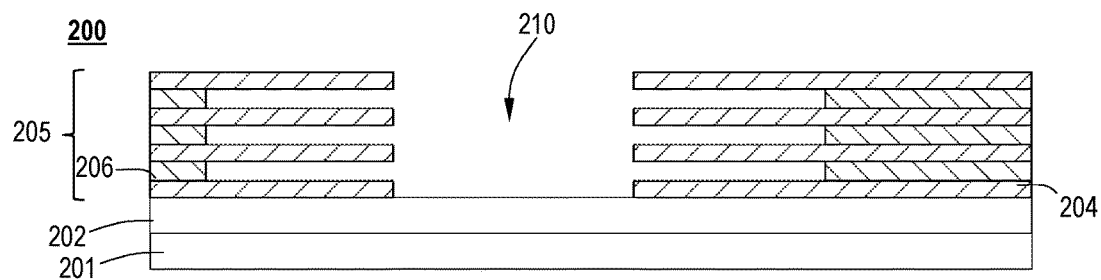
FIG. 8B illustrates a cross-sectional view of a device according to one or more embodiments.

Referring to FIG. 8B, the device 200 is subjected to a high aspect ratio (HAR) slit etch process to increase the depth of opening 210 such that the opening 210 extends to a top surface of the semiconductor layer 202. In one or more embodiments, the width of the opening 210 is in a range of from about 30 nm to about 160 nm. The second material layer 206 is then recessed. In some embodiments, second material layer 206 comprises polysilicon. In one or more embodiments the recess depth of the polysilicon is in a range of from about 100 nm to about 400 nm.

With reference to FIG. 8C, a third material 212 and a fourth material 214 are selectively grown. In one or more embodiments, the third material 212 and the fourth material 214 may comprise any suitable material known to the skilled artisan. In one or more embodiments, the third material 212 and the fourth material 214 independently comprise one or more of silicon (Si), silicon germanium (SiGe), or other selective deposition material sets. In one or more embodiments, the third material 212 and the fourth material 214 are deposited by selective reaction or epitaxial deposition. In one or more embodiments, the third material 212 comprises silicon germanium (SiGe) and the fourth material 214 comprises silicon (Si).

Referring to FIG. 8D, the process is repeated and a third material 212 and a fourth material 214 are selectively grown to form active regions at a fine pitch.

Figure 9C:
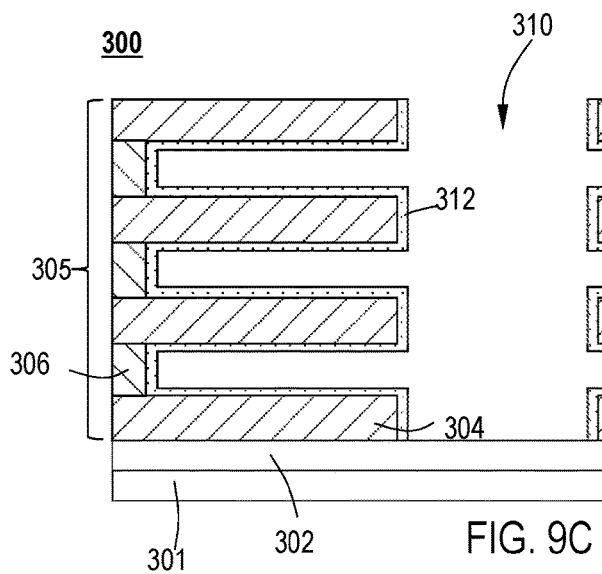
FIG. 9C illustrates a cross-sectional view of a device according to one or more embodiments.

In one or more embodiments, a combination non-selective and selective deposition method is used for 3D pitch multiplication. FIGS. 9A to 9G illustrate cross-sectional views of a device 300 prepared using the combination non-selective and selective deposition method of one or more embodiments. With reference to FIG. 9A, in one or more embodiments, a memory stack 305 is formed. The memory stack 305 in the illustrated embodiment comprises a plurality of alternating the first material layers 304 and the second material layer 306 on a semiconductor layer 302 on a substrate 301.

In one or more embodiments, a semiconductor layer 302 is on the substrate 301. In one or more embodiments, the semiconductor layer 302 may also be referred to as the logic interface layer. The semiconductor layer 302 can be formed by any suitable technique known to the skilled artisan.

An optional sacrificial layer (not illustrated) may be formed on the semiconductor layer 302 and can be made of any suitable material. The sacrificial layer in some embodiments is removed and replaced in later processes. In some embodiments, the sacrificial layer is not removed and remains within the electronic device, e.g. a memory device. In this case, the term "sacrificial" has an expanded meaning to include permanent layers and may be referred to as the conductive layer.

In one or more embodiments, the first material layer 304 and the second material layer 306 may comprise any suitable material known to the skilled artisan. In one or more embodiments, the first material layer 304 and the second material layer 306 independently comprise one or more of silicon (Si), silicon germanium (SiGe), silicon nitride (SiN), and polysilicon. In one or more embodiments, the first material layer 304 and the second material layer 306 are deposited by one or more of plasma enhanced chemical vapor deposition (PECVD), physical vapor deposition (PVD), or epitaxial deposition. This process can be used for any multiple layer film stack deposition, e.g. Si/SiGe, on any substrate including a dielectric, including, but not limited to, silicon dioxide ($SiO_2$), and a semiconductor substrate, including, but not limited to, silicon (Si) or silicon germanium (SiGe). In one or more embodiments, the first material layer 304 comprises silicon (Si) and the second material layer 306 comprises silicon germanium (SiGe).

In one or more embodiments, the first material layer 304 and the second material layer 306 may have any suitable thickness. In specific embodiments, the first material layer 304 has a thickness in a range of about 15 nm to about 25 nm, including about 20 nm. In specific embodiments, the second material layer 306 has a thickness in a range of about 35 nm to about 45 nm, including about 40 nm.

While the memory stack 305, illustrated in FIG. 9A, has three pairs of alternating first material layers 304 and second material layers 306, one of skill in the art recognizes that this is merely for illustrative purposed only. The memory stack 305 may have any number of alternating first material layers 304 and second material layers 306. For example, in some embodiments, the memory stack 305 comprises 192 pairs of alternating first material layers 304 and second material layers 306. In other embodiments, the memory stack 305 comprises greater than 50 pairs of alternating first material layers 304 and second material layers 306, or greater than 100 pairs of alternating first material layers 304 and second material layers 306, or greater than 300 pairs of alternating first material layers 304 and second material layers 306.

In one or more embodiments, a hard mask 308 is on a top surface of the memory stack 305. In one or more embodiments, the hard mask layer 308 can be deposited using one or more mask layer deposition techniques known to one of ordinary skill in the art of microelectronic device manufacturing. In one or more embodiments, the hard mask layer 308 is deposited using one of deposition techniques, such as, but not limited to, ALD, CVD, PVD, MBE, MOCVD, spin-on, or other deposition techniques known to the skilled artisan. In one or more embodiments, the hard mask layer 308 comprises a material selected from one or more of spin-on carbon, hard mask, or a photoresist. The skilled artisan will understand that multiple hard mask layers 308 may be present. In one or more embodiments, the hard mask layer 308 comprises silicon nitride (SiN).

In one or more embodiments, the device 300 is patterned to form an active area slit opening 310. Patterning may comprises any suitable patterning technique known to one of skill in the art.

Referring to FIG. 9B, the second material layer 306 is recessed through opening 310. The method to recess may be wet chemical or vapor phase etching or reactive gas phase etching, which is common to those skilled in the art.

Referring to FIG. 9C, a chemical oxide layer 312 is grown surrounding the first material layer 304 and the recessed second material layer 306. The oxide layer 312 may be a chemical oxidation or formed by any suitable method known to the skilled artisan. In one or more embodiments, the chemical oxide layer 312 comprises silicon dioxide (SiOx). In one or more embodiments, the chemical oxide layer 312 has a thickness in a range of from about 1 nm to about 5 nm, including about 2 nm, about 3 nm, and about 4 nm. In one or more embodiments, the chemical oxide layer 312 is substantially conformal. As used herein, a layer which is "substantially conformal" refers to a layer where the thickness is about the same throughout. A layer which is substantially conformal varies in thickness by less than or equal to about 10%, 5%, 2% or 0.5%.

Figure 9D:
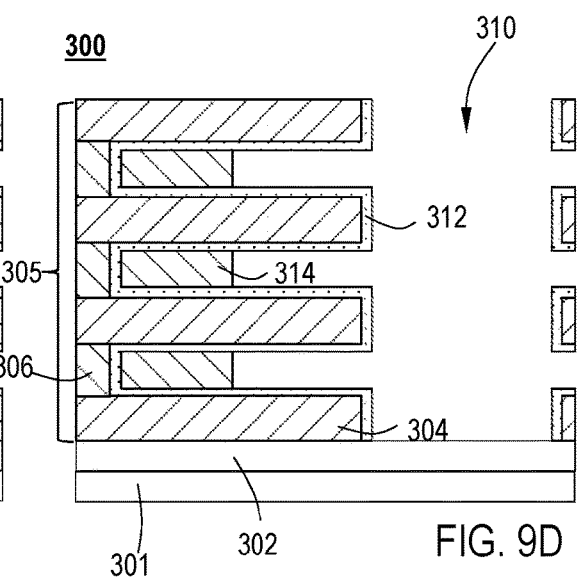
FIG. 9D illustrates a cross-sectional view of a device according to one or more embodiments.

With reference to FIG. 9D, additional second material layer is deposited to fill the gap in the tier, and is then recessed by wet, vapor or reactive gas reaction to leave a plug 314 of the desired horizontal dimension for the memory cell structuring.

Figure 9E:
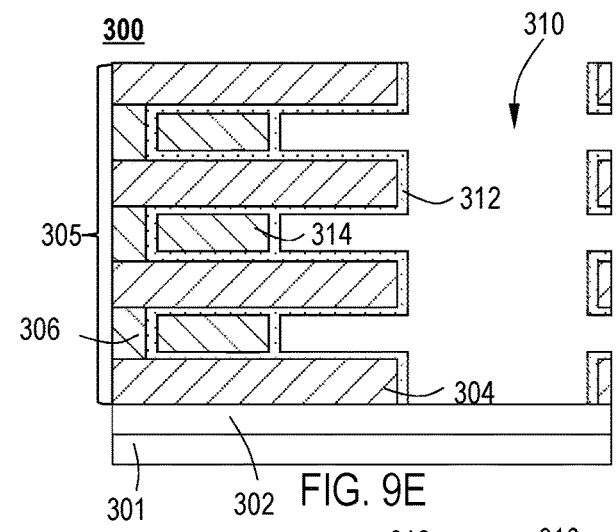
FIG. 9E illustrates a cross-sectional view of a device according to one or more embodiments.

Referring to FIG. 9E, additional chemical oxide layer 312 is grown surrounding the plug 314. The chemical oxide layer 312 may comprise any suitable material known to the skilled artisan. In one or more embodiments, the chemical oxide layer 312 comprises silicon dioxide ($SiO_2$). In one or more embodiments, the chemical oxide layer 312 has a thickness in a range of from about 1 nm to about 5 nm, including about 2 nm, about 3 nm, and about 4 nm. In one or more embodiments, the chemical oxide layer 312 is substantially conformal. As used herein, a layer which is "substantially conformal" refers to a layer where the thickness is about the same throughout. A layer which is substantially conformal varies in thickness by less than or equal to about 10%, 5%, 2% or 0.5%.

Figure 9F:
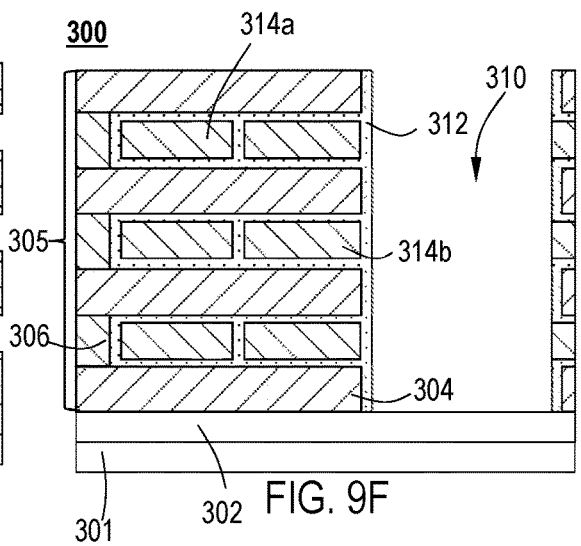
FIG. 9F illustrates a cross-sectional view of a device according to one or more embodiments.

Referring to FIG. 9F, additional second material layer is deposited to fill the tier, and is then recessed to leave a plug 314a and 314b. Additional chemical oxide layer 312 is grown surrounding the plug 314b. The chemical oxide layer 312 may comprise any suitable material known to the skilled artisan. In one or more embodiments, the chemical oxide layer 312 comprises silicon dioxide (SiOx). In one or more embodiments, the chemical oxide layer 312 has a thickness in a range of from about 1 nm to about 5 nm, including about 2 nm, about 3 nm, and about 4 nm. In one or more embodiments, the chemical oxide layer 312 is substantially conformal. As used herein, a layer which is "substantially conformal" refers to a layer where the thickness is about the same throughout. A layer which is substantially conformal varies in thickness by less than or equal to about 10%, 5%, 2% or 0.5%.

In one or more embodiments, the deposition of second material layer (e.g. silicon germanium (SiGe)) and chemical oxide layer 312 is repeated to form active regions at a fine pitch.

Figure 9G:
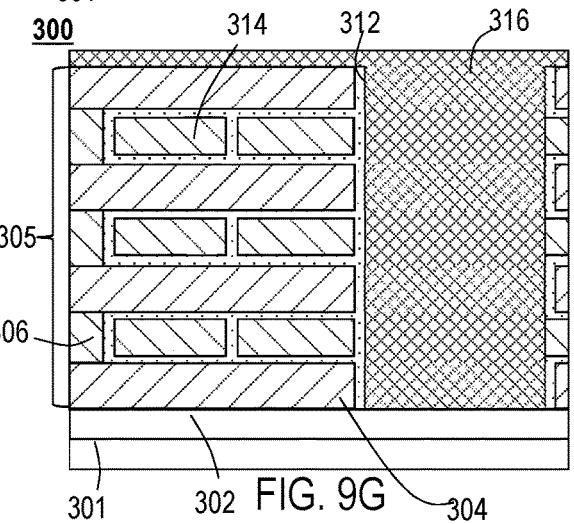
FIG. 9G illustrates a cross-sectional view of a device according to one or more embodiments.

Referring to FIG. 9G, a fill material 316 is deposited to fill the opening 310. The fill material may comprise any suitable fill material known to the skilled artisan. In one or more embodiments, the fill material 316 comprises silicon.

Figure 10A:
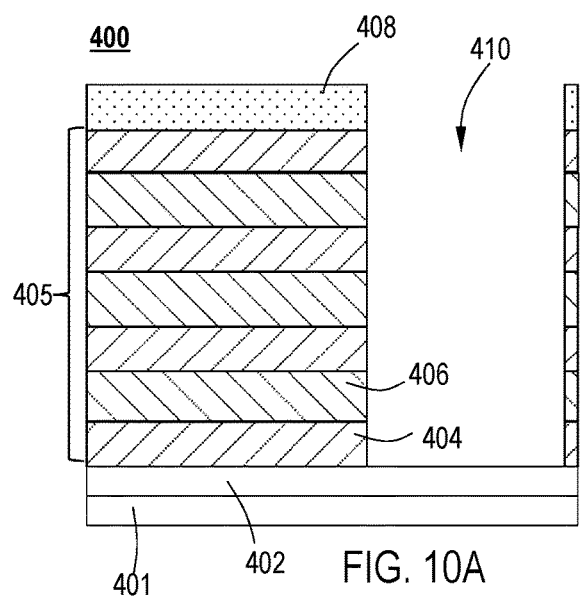
FIG. 10A illustrates a cross-sectional view of a device according to one or more embodiments.
Figure 10B:
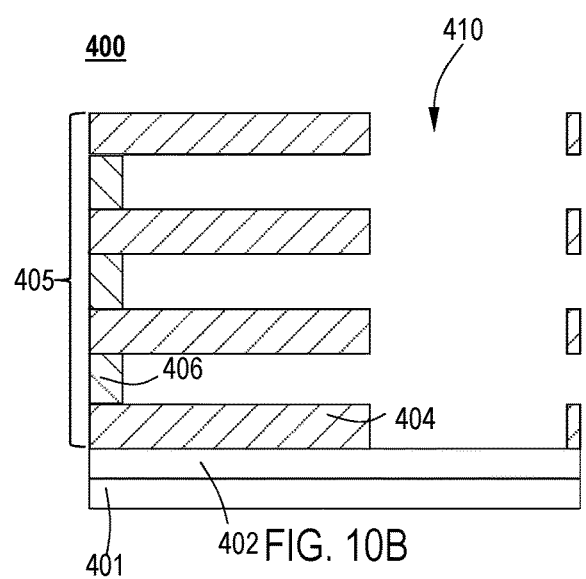
FIG. 10B illustrates a cross-sectional view of a device according to one or more embodiments.
Figure 10C:
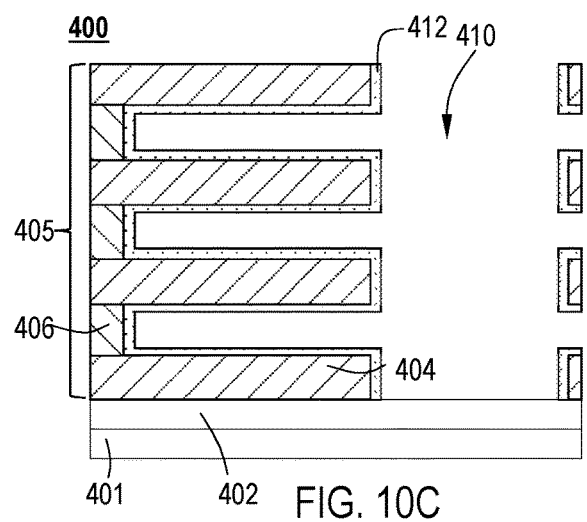
FIG. 10C illustrates a cross-sectional view of a device according to one or more embodiments.

In one or more embodiments, a combination non-selective and selective deposition method is used for 3D pitch multiplication. FIGS. 10A to 10C illustrate cross-sectional views of a device 400 prepared using the combination non-selective and selective deposition method of one or more embodiments. With reference to FIG. 10A, in one or more embodiments, a memory stack 405 is formed. The memory stack 405 in the illustrated embodiment comprises a plurality of alternating the first material layers 404 and the second material layers 406 on a semiconductor layer 402 on a substrate 401.

In one or more embodiments, a semiconductor layer 402 is on the substrate 401. In one or more embodiments, the semiconductor layer 402 may also be referred to as the logic interface layer. The semiconductor layer 402 can be formed by any suitable technique known to the skilled artisan.

An optional sacrificial layer (not illustrated) may be formed on the semiconductor layer 402 and can be made of any suitable material. The sacrificial layer in some embodiments is removed and replaced in later processes. In some embodiments, the sacrificial layer is not removed and remains within the electronic device, e.g. a memory device. In this case, the term "sacrificial" has an expanded meaning to include permanent layers and may be referred to as the conductive layer.

In one or more embodiments, the first material layer 404 and the second material layer 406 may comprise any suitable material known to the skilled artisan. In one or more embodiments, the first material layer 404 and the second material layer 406 independently comprise one or more of silicon (Si), silicon germanium (SiGe), silicon dioxide ($SiO_2$), silicon nitride (SiN), silicon oxynitride (SiON), and polysilicon. In one or more embodiments, the first material layer 404 and the second material layer 406 are deposited by one or more of plasma enhanced chemical vapor deposition (PECVD), physical vapor deposition (PVD), or epitaxial deposition. This process can be used for any multiple layer film stack deposition, e.g. Si/SiGe, on any substrate including a dielectric, including, but not limited to, silicon dioxide ($SiO_2$), and a semiconductor substrate, including, but not limited to, silicon (Si) or silicon germanium (SiGe). In one or more embodiments, the first material layer 404 comprises silicon (Si) and the second material layer 406 comprises silicon germanium (SiGe).

In one or more embodiments, the first material layer 404 and the second material layer 406 may have any suitable thickness. In specific embodiments, the first material layer 404 has a thickness in a range of about 15 nm to about 25 nm, including about 20 nm. In specific embodiments, the second material layer 406 has a thickness in a range of about 25 nm to about 45 nm, including about 30 nm, and about 35 nm.

While the memory stack 405, illustrated in FIG. 10A, has three pairs of alternating first material layers 404 and second material layers 406, one of skill in the art recognizes that this is merely for illustrative purposed only. The memory stack 405 may have any number of alternating first material layers 404 and second material layers 406. For example, in some embodiments, the memory stack 405 comprises 192 pairs of alternating first material layers 404 and second material layers 406. In other embodiments, the memory stack 405 comprises greater than 50 pairs of alternating first material layers 404 and second material layers 406, or greater than 100 pairs of alternating first material layers 404 and second material layers 406, or greater than 300 pairs of alternating first material layers 404 and second material layers 406.

In one or more embodiments, a hard mask 408 is on a top surface of the memory stack 405. In one or more embodiments, the hard mask layer 408 can be deposited using one or more mask layer deposition techniques known to one of ordinary skill in the art of microelectronic device manufacturing. In one or more embodiments, the hard mask layer 408 is deposited using one of deposition techniques, such as, but not limited to, ALD, CVD, PVD, MBE, MOCVD, spin-on, or other deposition techniques known to the skilled artisan. In one or more embodiments, the hard mask layer 408 comprises a material selected from one or more of spin-on carbon, hard mask, or a photoresist. The skilled artisan will understand that multiple hard mask layers 408 may be present. In one or more embodiments, the hard mask layer 408 comprises silicon nitride (SiN).

In one or more embodiments, the device 400 is patterned to form an active area opening 410. Patterning may comprise any suitable patterning technique known to one of skill in the art.

Referring to FIG. 10B, the second material layer 406 is recessed through opening 410.

Referring to FIG. 10C, a chemical oxide layer 412 is grown surrounding the first material layer 404 and the recessed second material layer 406. The chemical oxide layer 412 may comprise any suitable material known to the skilled artisan. In one or more embodiments, the chemical oxide layer 412 comprises silicon dioxide (SiOx). In one or more embodiments, the chemical oxide layer 412 has a thickness in a range of from about 1 nm to about 5 nm, including about 2 nm, about 3 nm, and about 4 nm. In one or more embodiments, the chemical oxide layer 412 is substantially conformal. As used herein, a layer which is "substantially conformal" refers to a layer where the thickness is about the same throughout. A layer which is substantially conformal varies in thickness by less than or equal to about 10%, 5%, 2% or 0.5%.

Figure 11A:
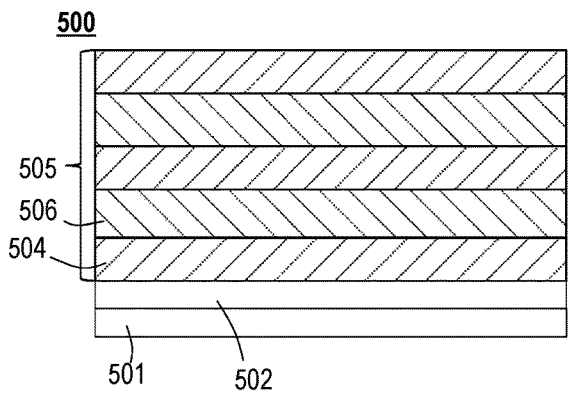
FIG. 11A illustrates a cross-sectional view of a device according to one or more embodiments.

In one or more embodiments, a non-selective deposition and recess method is used for 3D pitch multiplication. FIGS. 11A to 11G illustrate cross-sectional views of a device 500 prepared using the non-selective deposition and recess method of one or more embodiments. With reference to FIG. 11A, in one or more embodiments, a memory stack 505 is formed. The memory stack 505 in the illustrated embodiment comprises a plurality of alternating the first material layers 504 and the second material layers 506 on a semiconductor layer 502 on a substrate 501.

In one or more embodiments, a semiconductor layer 502 is on the substrate 401. In one or more embodiments, the semiconductor layer 502 may also be referred to as the logic interface layer. The semiconductor layer 502 can be formed by any suitable technique known to the skilled artisan.

An optional sacrificial layer (not illustrated) may be formed on the semiconductor layer 502 and can be made of any suitable material. The sacrificial layer in some embodiments is removed and replaced in later processes. In some embodiments, the sacrificial layer is not removed and remains within the electronic device, e.g. a memory device. In this case, the term "sacrificial" has an expanded meaning to include permanent layers and may be referred to as the conductive layer.

In one or more embodiments, the first material layer 504 and the second material layer 506 may comprise any suitable material known to the skilled artisan. In one or more embodiments, the first material layer 504 and the second material layer 406 independently comprise one or more of silicon (Si), silicon germanium (SiGe), silicon dioxide ($SiO_2$), silicon nitride (SiN), silicon oxynitride (SiON), and polysilicon. In one or more embodiments, the first material layer 504 and the second material layer 506 are deposited by one or more of plasma enhanced chemical vapor deposition (PECVD), physical vapor deposition (PVD), or epitaxy. This process can be used for any multiple layer film stack deposition, e.g. Si/SiGe, on any substrate including a dielectric, including, but not limited to, silicon dioxide ($SiO_2$), and a semiconductor substrate, including, but not limited to, silicon (Si) or silicon germanium (SiGe). In one or more embodiments, the first material layer 504 comprises polysilicon and the second material layer 506 comprises silicon dioxide (SiOx).

In one or more embodiments, the first material layer 504 and the second material layer 506 may have any suitable thickness. In specific embodiments, the first material layer 504 has a thickness in a range of about 15 nm to about 25 nm, including about 20 nm. In specific embodiments, the second material layer 506 has a thickness in a range of about 25 nm to about 35 nm, including about 30 nm.

While the memory stack 505, illustrated in FIG. 11A, has two pairs of alternating first material layers 504 and second material layers 506, one of skill in the art recognizes that this is merely for illustrative purposed only. The memory stacks may have any number of alternating first material layers 504 and second material layers 506. For example, in some embodiments, the memory stack 505 comprises 192 pairs of alternating first material layers 504 and second material layers 506. In other embodiments, the memory stack 505 comprises greater than 50 pairs of alternating first material layers 504 and second material layers 506, or greater than 100 pairs of alternating first material layers 404 and second material layers 506, or greater than 300 pairs of alternating first material layers 404 and second material layers 506.

Figure 11B:
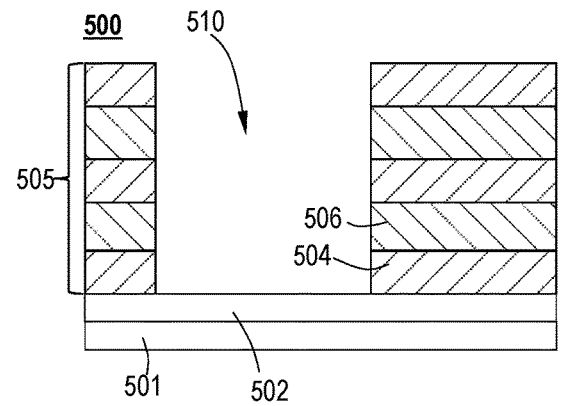
FIG. 11B illustrates a cross-sectional view of a device according to one or more embodiments.

Referring to FIG. 11B, in one or more embodiments, the device 500 is patterned to form an active area opening 510. Patterning may comprises any suitable patterning technique known to one of skill in the art.

Figure 11C:
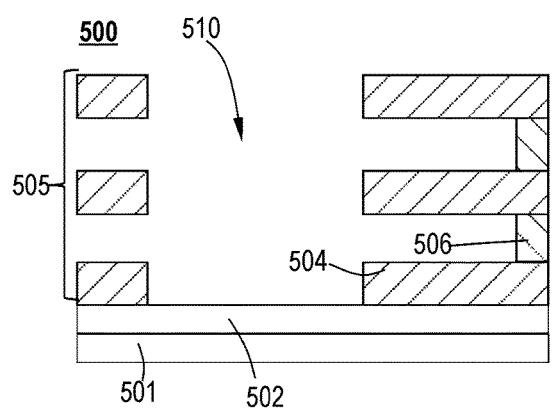
FIG. 11C illustrates a cross-sectional view of a device according to one or more embodiments.

Referring to FIG. 11C, the second material layer 506 is recessed through opening 510. The silicon layer 506 can then be recessed using any suitable recess technique known to the skilled artisan, including, but not limited to, wet etching, vapor etching, isotropic plasma etch or any other Selective Removal Process (SRP).

Figure 11D:
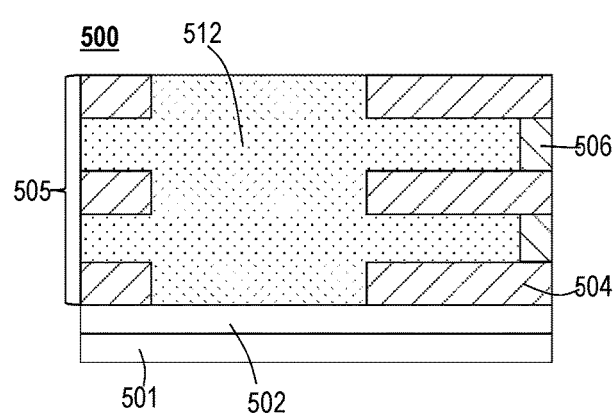
FIG. 11D illustrates a cross-sectional view of a device according to one or more embodiments.

Referring to FIG. 11D, a fill material 512 is deposited into opening 510 to fill the opening. The fill material 512 may comprise any suitable material known to one of skill in the art. In one or more embodiments, the fill material comprises phospho silicate glass (PSG), which is 1-10% P2O5 doped silicon dioxide.

Figure 11E:
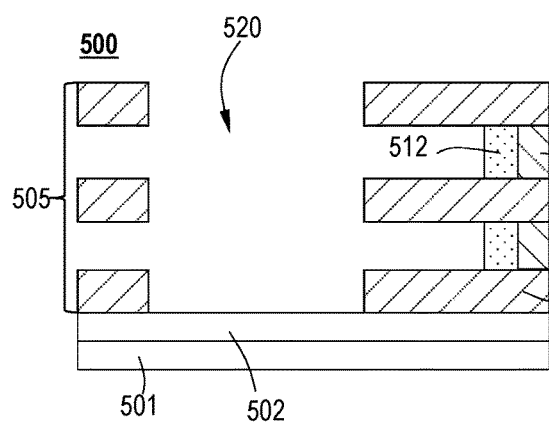
FIG. 11E illustrates a cross-sectional view of a device according to one or more embodiments.
Figure 11F:
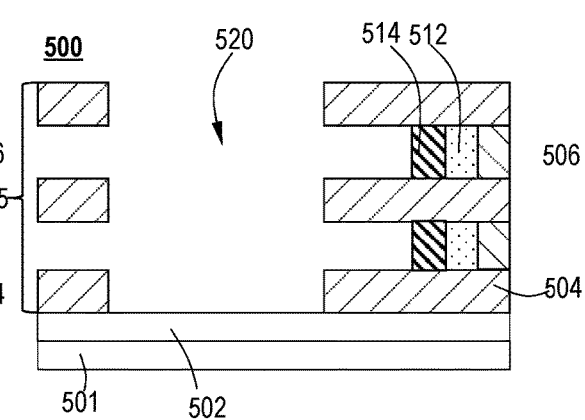
FIG. 11F illustrates a cross-sectional view of a device according to one or more embodiments.

With reference to FIG. 11E, the fill material 512 is recessed, forming an opening 520. As illustrated in FIG. 11F, undoped oxide 514 is deposited and recessed.

Figure 11G:
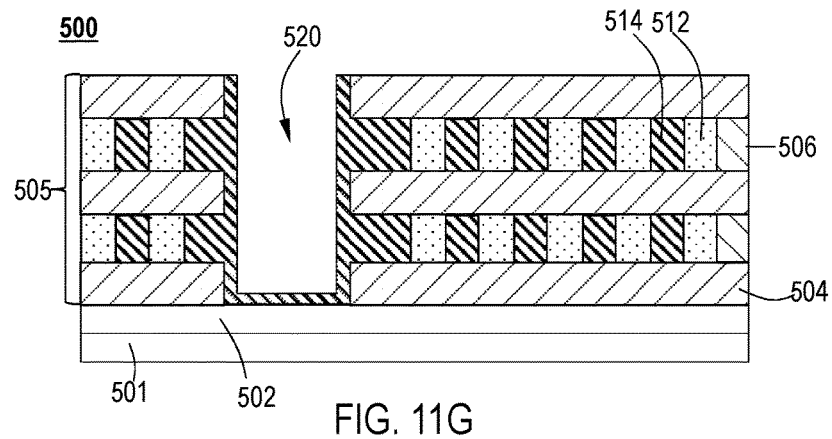
FIG. 11G illustrates a cross-sectional view of a device according to one or more embodiments.

Referring to FIG. 11G, filled material 512 and undoped oxide 514 are alternatively deposited and recessed. This can be done as few as 1 time or as many as 8 times or even more, to achieve the desired number of alternating films to define the region of each feature and space between those features respectively.

One or more embodiments of the disclosure are directed to semiconductor memory device. In one embodiment, semiconductor memory device comprises: a first memory stack comprising alternating first material layers and second material layers on a first portion of the device, the first memory stack comprising a first active area having a first width and a first space; a second memory stack on a second portion of the device, the second memory stack comprising alternating first material layers and second material layers and comprising a second active area having a second width and a second space; and a high aspect ratio opening separating the first portion from the second portion; and a dielectric layer separating the first material layers from the second material layers, repeating this to fill the recess gap, wherein the pitch of the first active area and the second active area is in a range of from about 50 nm to about 80 nm.

Additional embodiments of the disclosure are directed to methods of forming an electronic device. In one an embodiment, a method of forming an electronic device comprises: forming a memory stack comprising alternating layers of a first material layer and a second material layer; forming an opening in the memory stack; recessing the second material layer to form a gap; growing a third material on the second material in the gap; conformal deposition of a fourth material to fill the gap and recessing it partially back adjacent to the third material to form an active area, repeating this to fill the recess gap, wherein the pitch of the active area is in a range of from about 50 nm to about 100 nm.

Figure 12:
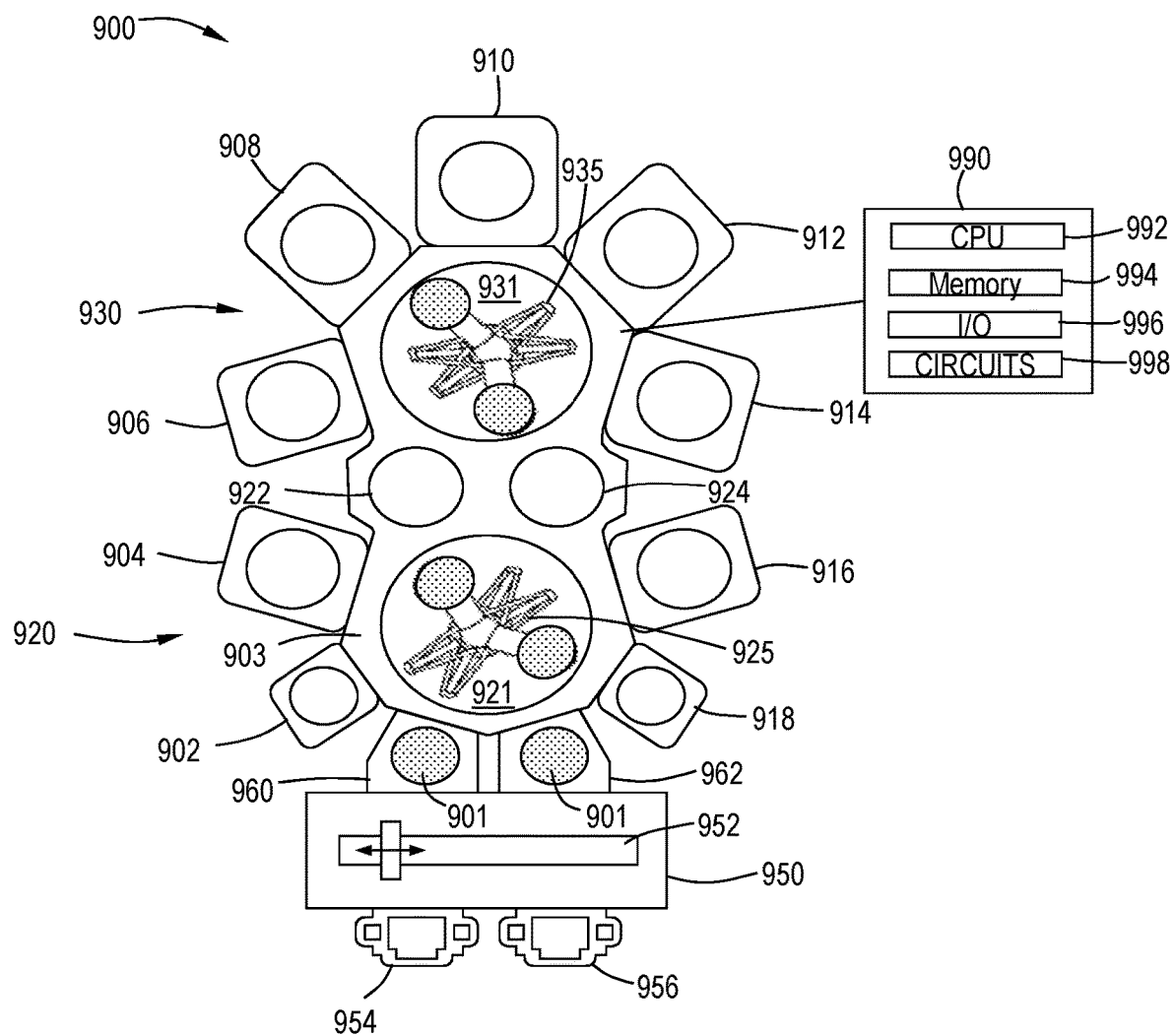
FIG. 12 illustrates a cluster tool according to one or more embodiments.

Additional embodiments of the disclosure are directed to processing tools 900 for the formation of the memory devices and methods described, as shown in FIG. 12.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber and crystallization agent removal chamber. The particular arrangement of process chambers and components can be varied depending on the cluster tool and should not be taken as limiting the scope of the disclosure.

The deposition chamber of some embodiments comprises one or more of an atomic layer deposition chamber, a plasma enhanced atomic layer deposition chamber, a chemical vapor deposition chamber, a plasma enhanced chemical vapor deposition chamber or a physical deposition chamber. In some embodiments, the cluster tool 900 includes a pre-cleaning chamber connected to the central transfer station.

In the embodiment shown in FIG. 12, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control the annealing chamber to anneal a wafer at a temperature in the range of about 300° C. to about 700° C. for a time the range of about 0.1 to about 12 hours. In some embodiments, the controller 990 has a configuration to activate the pre-cleaning chamber to remove an oxide layer from the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A semiconductor memory device comprising:
    a first memory stack comprising alternating layers of a first material layer and a recessed second material layer on a first portion of the device, the first memory stack comprising a first active area having a first width and a first space, wherein the first material layer comprises silicon (Si) and the recessed second material layer comprises silicon germanium (SiGe);
    a second memory stack on a second portion of the device, the second memory stack comprising alternating layers of the first material layer and the recessed second material layer and comprising a second active area having a second width and a second space; and
    a high aspect ratio opening separating the first portion from the second portion; and
    a dielectric layer between the recessed second material layer and an adjacent second material layer, the dielectric layer separating the first material layer from an adjacent first material layer,
    wherein a pitch of the first active area and the second active area is in a range of from about 50 nm to about 80 nm.

2. The device of claim 1, wherein the dielectric layer comprises one or more of oxides, carbon doped oxides, silicon dioxide ($SiO_2$), porous silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH).

3. The device of claim 1, wherein the high aspect ratio opening has a width in a range of from about 80 nm to about 160 nm.

4. The device of claim 1, wherein the first width and the second width are independently in a range of about 30 nm to about 100 nm.

5. The device of claim 1, wherein the first space and the second space are in independently in a range of about 3 nm to about 40 nm.

6. A method of forming an electronic device, the method comprising:
    forming a memory stack comprising alternating layers of a first material layer and a second material layer;
    forming an opening in the memory stack;
    recessing the second material layer to form a gap and a recessed second material layer;
    growing a third material in the gap; and
    growing a fourth material in the gap adjacent to the third material to form an active area,
    wherein a pitch of the active area is in a range of from about 50 nm to about 100 nm.

7. The method of claim 6, wherein the first material layer and second material layer independently comprise one or more of silicon (Si), silicon germanium (SiGe), silicon dioxide ($SiO_2$), silicon nitride (SiN), silicon oxynitride (SiON), and polysilicon.

8. The method of claim 6, wherein the first material layer comprises silicon (Si) and the second material layer comprises silicon germanium (SiGe).

9. The method of claim 6, wherein the first material layer comprises silicon dioxide ($SiO_2$) and the second material layer comprises polysilicon.

10. The method of claim 6, wherein the opening has a width in a range of from about 80 nm to about 160 nm.

11. The method of claim 6, wherein the active area has a width in a range of about 50 nm to about 100 nm.

12. The method of claim 6, wherein the active area has a space in a range of about 4 nm to about 40 nm.

13. The method of claim 6, further comprising depositing a conformal oxide layer on the recessed second material layer.

14. The method of claim 6, further comprising depositing a fill material in the opening.

15. The method of claim 14, wherein the fill material comprises silicon.

16. A non-transitory computer readable medium including instructions, that, when executed by a controller of a processing system, causes the processing system to perform operations of:
   form a memory stack comprising alternating layers of a first material layer and a second material layer;
   form an opening in the memory stack;
   recess the second material layer to form a gap and a recessed second material layer;
   grow a third material in the gap; and
   grow a fourth material in the gap adjacent to the third material to form an active area,
   wherein a pitch of the active area is in a range of from about 50 nm to about 100 nm.

17. The non-transitory computer readable medium of claim 16, further comprising including instructions, that, when executed by a controller of a processing system, causes the processing system to perform operations of:
   deposit a conformal oxide layer on the recessed second material layer.

* * * * *